US006762598B1

(12) United States Patent
Hemminger et al.

(10) Patent No.: US 6,762,598 B1
(45) Date of Patent: Jul. 13, 2004

(54) METHOD FOR PROVIDING OPTICAL TEST SIGNALS FOR ELECTRONIC METER TESTING

(75) Inventors: Rodney C. Hemminger, Raleigh, NC (US); Mark L. Munday, Raleigh, NC (US)

(73) Assignee: Elster Electricity, LLC, Raleigh, NC (US)

( * ) Notice: Subject to any disclaimer, the term of this patent is extended or adjusted under 35 U.S.C. 154(b) by 786 days.

(21) Appl. No.: 08/478,606

(22) Filed: Jun. 7, 1995

Related U.S. Application Data

(63) Continuation of application No. 07/839,634, filed on Feb. 21, 1992, now Pat. No. 5,537,029.

(51) Int. Cl.[7] ........................ G01R 21/06; G01R 35/04; G06F 17/00
(52) U.S. Cl. ........................... 324/142; 324/74; 702/64
(58) Field of Search ............................ 324/142, 74, 96, 324/130, 157, 107, 141; 702/60, 61, 62, 85, 86, 64, 65; 364/571.02

(56) References Cited

U.S. PATENT DOCUMENTS

| 2,724,821 A | 11/1955 | Schweitzer, Jr. ............. 340/201 |
| 3,794,917 A | 2/1974 | Martin et al. ................ 324/142 |
| 3,806,875 A | 4/1974 | Georget ...................... 340/151 |

(List continued on next page.)

FOREIGN PATENT DOCUMENTS

| AU | B-68113/87 | 8/1987 |
| EP | 0 092 303 B1 | 10/1983 |
| EP | 0 288 413 A1 | 10/1988 |
| EP | 0 288 413 | 10/1990 |
| EP | 0 462 045 A1 | 12/1991 |
| EP | 0 462 045 | 12/1991 |
| GB | 2 095 879 | 10/1982 |
| GB | 2177 805 A | 1/1987 |

(List continued on next page.)

OTHER PUBLICATIONS

Negahban, M. et al., "A DSP–based Watthour Meter," IEEE International Solid–State Circuits Conference. DIgest of Technical Papers. 36th ISSC. 1st Ed., NY, NY USA, Feb. 15–17, 1989.

USenko, V.V. et al., "Meter For Recording the Energy of gingle and Rarely–Repeating Ultrahigh–Energy Pulses," Radiotekhnika, Kharkov, Ukrainian SSR, No. 86, pp. 44–48, 1988, 2 REE. [Article unobtainable; abstract only available and enclosed herewith].

Landis & Gyr, *ZMA110m402—Solid State Precision Meter IEC Class 1.0* .

(List continued on next page.)

*Primary Examiner*—Ernest Karlsen
(74) *Attorney, Agent, or Firm*—Woodcock Washburn LLP

(57) ABSTRACT

Methods and apparatus for electronically displaying metered electrical energy are disclosed. A first processor receives voltage and current signals, determines electrical energy and generates an energy signal representative of the electrical energy determination. A second processor receives the energy signal and generates a display signal representative of electrical energy information. A display receives the display signal and displays the electrical energy information. In a first embodiment, it is preferred for the first processor to determine units of electrical energy and the rate at which the units are determined. The second processor generates a display signal representative of the units and the rate. The second processor may also generate a disk signal representative of an equivalent rate of disk rotation in relation to the rate at which the units are determined and energy flow direction information for display. A converter may also be provided for converting an electrical output signal to light. The second processor, connected to the converter, generates the electrical output signal in response to the energy signals, wherein the output signal includes a multiplexed arrangement of the energy signals.

33 Claims, 8 Drawing Sheets

U.S. PATENT DOCUMENTS

| | | |
|---|---|---|
| 3,826,985 A | 7/1974 | Wiley .......................... 324/173 |
| 3,976,941 A | 8/1976 | Milkovic .................... 324/142 |
| 4,007,061 A | 2/1977 | Le Couturier .............. 136/221 |
| 4,034,292 A | 7/1977 | McClelland, III .......... 324/157 |
| 4,077,061 A | 2/1978 | Johnston et al. ........... 364/483 |
| 4,092,592 A | 5/1978 | Milkovic .................... 324/142 |
| 4,096,436 A | 6/1978 | Cook et al. ................. 324/142 |
| 4,119,948 A | 10/1978 | Ward et al. ................ 340/151 |
| 4,120,031 A | 10/1978 | Kincheloe et al. .......... 364/464 |
| 4,131,844 A | 12/1978 | Hucker et al. ................ 323/46 |
| 4,156,273 A | 5/1979 | Sato ............................ 363/56 |
| 4,156,931 A | 5/1979 | Adelman et al. ........... 364/900 |
| 4,156,932 A | 5/1979 | Robinson et al. ........... 364/200 |
| 4,158,810 A | 6/1979 | Leskovar .................... 324/127 |
| 4,186,339 A | 1/1980 | Finger ........................ 324/142 |
| 4,209,826 A | 6/1980 | Priegnitz ..................... 363/21 |
| 4,213,119 A | 7/1980 | Ward et al. ................. 340/157 |
| 4,283,772 A | 8/1981 | Johnston ..................... 364/900 |
| 4,291,375 A | 9/1981 | Wolf .......................... 364/483 |
| 4,298,839 A * | 11/1981 | Johnston ..................... 324/157 |
| 4,301,508 A | 11/1981 | Anderson et al. ........... 364/483 |
| 4,315,248 A | 2/1982 | Ward ...................... 340/825.72 |
| 4,335,445 A | 6/1982 | Nercessian ................. 364/900 |
| 4,355,361 A | 10/1982 | Riggs et al. ................. 364/464 |
| 4,359,684 A | 11/1982 | Ley ............................ 324/142 |
| 4,361,877 A | 11/1982 | Dyer et al. ................. 364/900 |
| 4,378,524 A | 3/1983 | Steinmuller ................. 324/107 |
| 4,389,702 A | 6/1983 | Clemente et al. ............. 363/21 |
| 4,399,510 A | 8/1983 | Hicks .......................... 364/464 |
| 4,407,061 A | 10/1983 | Grodkiewicz et al. ........ 29/576 |
| 4,415,853 A | 11/1983 | Fisher ......................... 324/74 |
| 4,420,721 A | 12/1983 | Dorey et al. ................ 324/110 |
| 4,422,039 A | 12/1983 | Davis .......................... 324/119 |
| 4,437,059 A | 3/1984 | Hauptmann ................. 324/142 |
| 4,438,485 A | 3/1984 | Voigt .......................... 363/21 |
| 4,439,764 A | 3/1984 | York et al. ............. 340/870.02 |
| 4,467,434 A | 8/1984 | Hurley et al. ............... 364/483 |
| 4,489,384 A | 12/1984 | Hurley et al. ............... 364/483 |
| 4,497,017 A | 1/1985 | Davis .......................... 363/49 |
| 4,509,128 A | 4/1985 | Coppola et al. ............. 364/483 |
| 4,516,213 A | 5/1985 | Gidden ....................... 364/483 |
| 4,542,469 A | 9/1985 | Brandyberry et al. ....... 364/483 |
| 4,566,060 A | 1/1986 | Hoeksma .................... 363/21 |
| 4,581,705 A | 4/1986 | Gilker et al. ................ 364/492 |
| 4,600,881 A | 7/1986 | La Rocca et al. ............. 327/74 |
| 4,607,320 A | 8/1986 | Matui et al. .................. 363/21 |
| 4,621,330 A | 11/1986 | Weikel ........................ 364/483 |
| 4,622,627 A | 11/1986 | Rodriguez et al. ............ 363/37 |
| 4,623,960 A | 11/1986 | Eng .............................. 363/21 |
| 4,642,634 A | 2/1987 | Gerri et al. ............. 340/870.02 |
| 4,646,084 A | 2/1987 | Burrowes et al. ...... 340/870.02 |
| 4,686,460 A | 8/1987 | Stevens et al. .............. 324/142 |
| 4,692,874 A | 9/1987 | Mihara ....................... 364/483 |
| 4,697,180 A | 9/1987 | Swanson ................ 340/870.02 |
| 4,700,280 A | 10/1987 | Onda et al. .................. 363/19 |
| 4,701,858 A | 10/1987 | Stokes et al. ............... 364/483 |
| 4,713,608 A | 12/1987 | Catiller et al. .............. 324/142 |
| 4,754,219 A | 6/1988 | Milkovic .................... 324/142 |
| 4,757,456 A | 7/1988 | Benghiat .................... 364/464 |
| 4,761,725 A | 8/1988 | Henze ......................... 363/46 |
| 4,794,369 A | 12/1988 | Haferd ........................ 341/166 |
| 4,803,632 A | 2/1989 | Frew et al. ............. 364/464.04 |
| 4,814,757 A | 3/1989 | Patterson et al. ........... 340/753 |
| 4,831,327 A | 5/1989 | Chenier et al. ............. 324/127 |
| 4,853,620 A | 8/1989 | Halder et al. ............... 324/142 |
| 4,862,493 A | 8/1989 | Venkataraman et al. .... 379/107 |
| 4,866,587 A | 9/1989 | Wadlington ................. 363/16 |
| 4,881,027 A | 11/1989 | Joder et al. ................. 324/107 |
| 4,881,070 A | 11/1989 | Burrowes et al. ..... 340/870.025 |
| 4,884,021 A * | 11/1989 | Hammond et al. |
| 4,896,106 A | 1/1990 | Voisine et al. .............. 324/142 |
| 4,902,964 A | 2/1990 | Szabela et al. ............. 324/103 |
| 4,902,965 A | 2/1990 | Bodrug et al. .............. 324/116 |
| 4,908,569 A | 3/1990 | Fest ........................... 324/120 |
| 4,908,769 A | 3/1990 | Vaughan et al. ....... 364/464.04 |
| 4,922,187 A | 5/1990 | Beverly, II ................... 324/96 |
| 4,922,399 A | 5/1990 | Tsuzuki ....................... 363/21 |
| 4,931,725 A | 6/1990 | Hutt et al. ................... 324/142 |
| 4,949,029 A | 8/1990 | Cooper et al. ................ 324/74 |
| 4,951,052 A | 8/1990 | Jacob et al. ................. 341/122 |
| 4,956,761 A | 9/1990 | Higashi ....................... 363/19 |
| 4,975,592 A | 12/1990 | Hahn et al. .................... 307/38 |
| 4,977,368 A | 12/1990 | Munday et al. ............. 324/142 |
| 4,978,911 A | 12/1990 | Perry et al. ................. 324/142 |
| 4,998,061 A | 3/1991 | Voisine et al. .............. 324/142 |
| 4,999,569 A | 3/1991 | Weikel ......................... 324/74 |
| 5,010,335 A * | 4/1991 | Coppola et al. .............. 324/96 |
| 5,014,213 A | 5/1991 | Edwards et al. ............ 364/483 |
| 5,017,860 A | 5/1991 | Germer et al. .............. 324/142 |
| 5,019,955 A | 5/1991 | Hoeksma ..................... 363/21 |
| 5,032,785 A | 7/1991 | Mathis et al. ............... 324/107 |
| 5,059,896 A | 10/1991 | Germer et al. .............. 324/142 |
| 5,122,735 A | 6/1992 | Porter et al. ................. 324/142 |
| 5,140,511 A | 8/1992 | Lee et al. ...................... 363/21 |
| 5,151,866 A | 9/1992 | Glaser et al. ................ 364/483 |
| 5,153,837 A | 10/1992 | Shaffer et al. ......... 364/464.004 |
| 5,173,657 A | 12/1992 | Holdsclaw .................. 324/142 |
| 5,175,675 A | 12/1992 | Uramoto ...................... 363/19 |
| 5,181,026 A | 1/1993 | Granville ............... 340/870.28 |
| 5,184,064 A | 2/1993 | Vicknair et al. ............. 324/156 |
| 5,229,713 A | 7/1993 | Bullock et al. .............. 324/142 |
| 5,245,275 A | 9/1993 | Germer et al. .............. 324/142 |
| 5,268,633 A | 12/1993 | Balch ........................... 324/74 |
| 5,270,958 A | 12/1993 | Dastous ....................... 364/569 |
| 5,287,287 A | 2/1994 | Chamberlain et al. ...... 364/483 |
| 5,296,803 A | 3/1994 | Kirby et al. ................. 324/156 |
| 5,315,527 A | 5/1994 | Beckwith .................... 364/483 |
| 5,325,051 A | 6/1994 | Germer et al. .............. 324/142 |
| 5,391,983 A | 2/1995 | Lusignan et al. ........... 324/142 |
| 5,457,621 A | 10/1995 | Munday et al. .............. 363/16 |
| 5,495,167 A * | 2/1996 | Cotroneo ...................... 324/74 |
| 5,537,029 A | 7/1996 | Hemminger et al. ........ 324/142 |
| 5,539,304 A * | 7/1996 | Payne et al. .................. 324/74 |
| 5,544,089 A | 8/1996 | Hemminger et al. ........ 364/492 |
| 5,548,209 A | 8/1996 | Lusignan et al. ........... 324/142 |
| 5,548,527 A | 8/1996 | Hemminger et al. ........ 364/492 |
| 5,555,508 A | 9/1996 | Munday et al. ............. 364/492 |
| 5,903,145 A | 5/1999 | Hemminger et al. ........ 324/142 |
| 6,229,295 B1 | 5/2001 | Hemminger et al. ........ 324/142 |

FOREIGN PATENT DOCUMENTS

| | | |
|---|---|---|
| JP | 61-11680 | 1/1986 |
| JP | 61-38569 | 2/1986 |
| JP | 61-284670 | 12/1986 |
| JP | 08-23974 | 9/1989 |
| JP | 1-239473 | 9/1989 |
| JP | 01-239473 | 9/1989 |
| JP | 1-239474 | 9/1989 |
| JP | 1-239475 | 9/1989 |
| JP | 01-239475 | 9/1989 |
| WO | WO 86/05887 | 10/1986 |

OTHER PUBLICATIONS

Landis & Gyr, *Bulletin 930 SSM2 Instruction/Technical Manual Polyphase Solid State Meter*, Landis & Gyr, Lafayette, Indiana.

Landis & Gyr, *Bulletin 920 SSM Instruction/Technical Solid State Meter Class 20 Form 9S*, First Publication Mar. 1987.

McGrath, Donald T., *Signal Processing Considerations in Power Management Applications*, GE Corporate Reserach and Development, 1991.

"Three–Phase, Watt–Hour Meter IC," *Electronic Design*, Feb. 23, 1989.

Garverick, Steven L., et al., "A Programmable Mixed–Signal ASIC for Power Metering," *IEEE Journal of Solid–State Circuits*, vol. 26, No. 12, Dec. 1991.

Gaverick, Steven L., et al., "A Programmable Mixed–Signal ASIC for Power Metering," *IEEE International Solid–State Circuits Conference*, 1991.

Summers, R., *Integrated Semiconductor Solutions for Metering and Telemetering Applications*, Texas Instruments, Apr. 1990.

Negahaban, M., *A DSP–Based Watthour Meter*, Silicon Systems, Inc., Nov. 23, 1988.

Laumann, H, et al., "Class 0,5 Precision Meter with Solid–State Measuring Elements", *Landis & Gyr Review*, Sep. 1974.

Landis & Gyr, "Electronic Meter, Class 0,2; ZFRI, ZMRI, " Jul. 1971.

Landis & Gyr, "Precision Solid–State Meters," Oct. 1988.

HP Eggenberger, "Ein Elektronischer Elektrizitä tszähler für Wirk– und Blindverauch," *Neue Zürcher Zeitung*, Sep. 6, 1989.

H. Kohler, "Elektronischer Hochpräzisionszähler im 19–Zoll–Einbaugehäuse für Wirkverbrauch– und Blindverbrauchzühlung," *Siemens Magazine*, pp. 345–349, 1977.

Nilsen, "EMS 2100 Electricity Consumption Analyser—Australian Design Award 1998," pp. 1–16.

*QUAD4® Plus Multifunction Electronic Meter*, User's Guide, Document A–117350, Revision L, Process Systems, Charlotte, NC, 1993.

M. Schwendtner, et al., "Elektronischer Haushaltszähler" *Elektrontechnische Zeitschrift etz*, vol. 112, No. 6–7, 1991, pp. 320–323, together with an English translation of the same ("Electronic Domestic Meter").

Steven L. Garverick et al., "A Programmable Mixed–Signal ASIC of Power Metering," ISSCC91/Session 2/Low–Temperature Circuits and Special–Purpose Processors/Paper WP 2.4, IEEE International Solid–State Circuits Conference, 1991.

*Quantum Multi–Function Polyphase Meter Type SQ400*, Preliminary Instruction Manual Draft III, Mar. 1983.

*ST–Q101 Series Electronic Meter*, Product Bulletin 10253, Schlumberger Industries, 1988.

*ST–Q200 Series System Measurement*, Product Bulletin 10255, Schlumberger Industries, 1988.

*Quantum™ Technical Guide*, Jul. 1989.

*ST–Q200 Series System Measurement*, Product Bulletin 10255, Schlumberger Industries, 1990.

*Quantum® Electronic Meter Field Reference Manual For Q101, Q111, Q121, Q200, Q210, Q220 and Q230 Electronic Meters*, Schlumberger Industries, (date unknown).

*ST–MT100 Electronic Time–of–Use Instruction Manual 0505*, Sangamo Westing, Inc., May 1987.

*MT100 Electronic Time–of–Use Register Instruction Manaul 0505*, Schlumberger Industries, Dec. 1991.

*ST–DS130 Recorder Module Product Bulletin 13157*, Schlumberger Industries, Sep. 1988.

"Enter the Electronic Metering Age with GE, The Electronic Polyphase Demand Meter, Ge electronic Metering", *GE Meters Brochure*, Somersworth, NH, Sep. 1989.

Kingston, G.A. et al., "Multi Function Polyphase Metering–An Integrated Approach", *Schlumberger Industries Electricity Management, UK*, (date unknown).

Garverick, S. L. "A Programmable Mixed–Signal ASIC of Power Metering", *IEEE Journal of Solid State Circuits*, Dec. 1991, 26(12), 2008–2016.

Gaverick, S. L. et al., "A Programmable Mixed–Signal ASIC for Power Metering", *IEEE International Solid State Circuits Conference*, Dec. 1991, 36–37.

Kohler, H., Elektronischer Hochprazisionzahler im 19–Zoll–Einbaughehause fur Wirkverbrauch–und Blindverbrauchzuhung, *Siemens Magazine*, (month unknown) 1977, 345–349.

Eggenberger, H.P., "An Electronic Electricity Meter for Active and Reactive Energy Consumption", *Nue Zurcher Zeitung*, Sep. 6, 1989.

In the Matter of Australian Patent Application 688711 in the name of ABB Power T&D Company, Inc., and In the Matter of Opposition Thereto by Electrowatt Technology Innovation Corporation, *Revised Statement of Grounds and Particulars in Support of Opposition*, Feb. 19, 1999.

Landis & Gry Instruction/Technical Manual, Solid State Meter Class 20, Form 9s, Bulletin 920, Lafayette, IN, Aug. 4, 1987.

Landis & Gyr, "Electronic Meter, Class 0, 2:ZFRI, ZNRI," Jul. 1971.

Landis & Gyr Instruction/Technical Manual, Solid State Meter Class 20 Form 9s Bulletin 920, Lafayette, IN, Aug. 4, 1987.

Landis & Gyr, Bulletin 930 SSM2 Instruction/Technical Manual Polyphase Solid State Meter, Lanids & Gyr, Lafayette, Indiana, (date unavailable).

Landis & Gyr, ZMA110m402–Solid State Precision Meter IEC Class 1.0, (date unavailable).

Landis & Gyr, "Z.T. Precision Solid–State Meters", Oct. 1988.

Laumann, H. et al., "Class 0,5 Precision Meter With Solid–State Measuring Elements", *Landis & Gyr Review*, Sep. 1974.

Lester, G., "A Communications Protocol for Reading and Programming Electronic Metering Devices from Hand Held Units", GEC Meters, UK, (date unknown).

Schwendtner, M. et al., "Elektronischer Haushaltszahler" Elektrontechnische Zeitschrift etz, vol. 112, 6(7), (month unknown) 1991, 320–323.

McGrath, D.T., "Signal Processing Considerations in Power Managment Applications", *GE Corporate Research and Development*, (month unavailable) 1991.

MT100 electronic Time–of–Use Register Instruction Manual 0505, Schlumberger Industries, Dec. 1991.

Negahaban, M., "A DSP Based Watthour Meter", *Silicon Systems, Inc.*, Nov. 23, 1988.

Negahban, M. et al., "A DSP–Based Watthour Meter", *IEEE International Solid State ircuits Conference DIgest of Technical Papers 36$^{th}$ $^{ISSC}$ 1$^{st}$ Ed., NY, NY, USA*, Feb. 15–17, 1989.

Nilsen, "EMS 2100 Electricity Cosumption Analyzer–Australian Design Award", (month unavailable) 1998, 1–16.

Hutt, P.R. et al. "Design, Benefits and Flexibility in Intelligent Metering Technology", *Polymeters Limited, UK*, (date unknown).

Product Brochure: "KVI Polyphase Combination Meter", Jul. 1988.

Progress in the Art of Metering Electric Energy, *The Institute of Electrical & Electronics Engineers, Inc*, Electricity Metering Subcomittee, Dec. 1969.

Quantum Multi–Function Polyphase Meter Typ SQ400, Preliminary Instruction Manual Draft III, Mar. 1983.

Quantum Technical Guide, Jul. 1989.

ST–MT 100 Electronic Time–of–Use Instruction Manual 0505, Sangamo Wesion Inc., May 1987.

Quantum.RTM. Electronics Meter Filed Reference Manual for Q101, Q111, Q121, Q200, Q210, Q220 and Q230 Electronic Meters, Schlumberger Industries, prior to Jan. 1991.

ST–DS130 Recorder Module Product Bulletin 13157, Schlumberger Industries, Sep., 1988.

ST–Q101 Series Electronic Meter, Product Bulletin 10253, Schlumberger Industries, Sep. 1988.

ST–Q200 Series System Measurement, Product Bulletin 10255, Schlumberger Industries, (month unavailable) 1988.

ST–Q200 Series System Measurement, Product Bulletin 10255, Schlumberger Industries, Nov. 1990.

Su, K. L., "Fundamentals of Circuits, Electronics and Signal Analysis", *Georgia Institute of Technology*, Atlanta, Ga, Dec. 1996, 1, 61–63.

Summers, R., Integrated Semiconductor Solutions for Metering and Telemetering Applications, Apr. 1990, Texas Instruments.

Usenko, VV. et al., "Meter for Recording the Energy of Single and Rarely–Repeating Ultrahigh–Energy Pulses", *Radiotekhnika, Kharkov*, Ukranian SSR, (month unknown) 1988, 86, 44–48.

In the Matter of Australian Patent Application No. 688711 in the name of ABB Power T & D Co. Inc and in the Matter of Opposition thereto by Electrowatt Technology Innovation Corp., Patents Act 1990, Decision of a Delegate of the Commisioner of Patents, Dec. 19, 2000, 14 pages.

Handbook for Electricty Metering, 9th Edition p. 17, 8, 896, 897, (month unavailable) 1992.

\* cited by examiner

US 6,762,598 B1

METHOD FOR PROVIDING OPTICAL TEST SIGNALS FOR ELECTRONIC METER TESTING

RELATED APPLICATION DATA

This application is a continuation of U.S. patent application Ser. No. 07/839,634, filed Feb. 21, 1992 now U.S. Pat. No. 5,537,029.

FIELD OF INVENTION

The present invention relates generally to the field of electric utility meters. More particularly, the present invention relates to both electronic watthour meters and meters utilized to meter real and reactive energy in both the forward and reverse directions.

BACKGROUND OF THE INVENTION

Techniques and devices for metering the various forms of electrical energy are well known. Meters, such as utility power meters, can be of two types, namely, electromechanical based meters whose output is generated by a rotating disk and electronic based meters whose output component is generated electronically. A hybrid meter also exists, wherein an electronic register for providing an electronically generated display of metered electrical energy has been combined, usually optically, to a rotating disk. Pulses generated by the rotating disk, for example by light reflected from a spot painted on the disk, are utilized to generate an electronic output signal.

It will be appreciated that electronic meters have gained considerable acceptance due to their increasing reliability and extended ambient temperature ranges of operation. Consequently, various forms of electronic based meters have been proposed which are virtually free of any moving parts. In the last ten years several meters have been proposed which include a microprocessor.

Testing of electronic meters has always been a problem. A special mode of register operation known in the industry as the test mode has been available to ease register testing, however, little has been done to improve overall meter testing. Electronic meters have the potential of providing faster test times, multiple metering functions and calibration of the meter through software adjustment. However, implementing such functions can be expensive and complicated.

Presently, electric utility companies can test mechanical meters with a piece of test equipment which can reflect light off a metered disk to detect a painted spot as the disk rotates. An alternative form of testing mechanical meters is disclosed in U.S. Pat. No 4,600,881—LaRocca et al. which describes the formation of a hole in the disk. A light sensitive device is placed in a fixed position on one side of the disk. As the disk rotates, and the hole passes over the light sensitive device, a pulse is provided indicating disk movement.

Since electronic meters preferably do not contain rotating disks, such simple testing techniques cannot be utilized. Consequently, a need exists for an electronic meter having a relatively simple means of testing the meter.

SUMMARY OF THE INVENTION

The previously described problem is resolved and other advantages are achieved in a method and apparatus for electronically displaying metered electrical energy are disclosed. A first processor receives voltage and current signals and determines electrical energy. The first processor generates an energy signal representative of the electrical energy determination. A second processor, connected to said first processor, receives the energy signal and generates a display signal representative of electrical energy information. A display is connected to receive the display signal and displays the electrical energy information. In a first embodiment it is preferred for the first processor to determine units of electrical energy from the voltage and current signals and to generate an energy signal representative of such units and the rate at which the units are determined. In this embodiment it is also preferred for the second processor to generate, in response to the energy signal, a disk signal representative of a rate of disk rotation equivalent to a traditional electromechanical meter and display signals are representative of the total number of units, the rate at which units are determined and the rate of equivalent disk rotation, wherein the display includes separate indicators for each display signal. In another embodiment the first processor, in concurrently determining units of electrical energy, determines watt units, apparent reactive energy units and the rate at which such units are determined, wherein the watt units, the apparent reactive energy units and the rate at which such units are determined are displayed. In still another embodiment, the first processor meters multiple types of electrical energy and generates energy signals. A first converter is provided for converting an electrical output signal to light. The second processor, connected to the first converter, generates an output signal in response to the energy signals, wherein the generation of the output signal includes the multiplexing of the energy signals into the output signal. In a still further embodiment, the display provides energy flow direction information.

It is preferred for the display to be a liquid crystal display containing a plurality of visible annunciators. It is especially preferred for the second processor to generate the display signal so that select annunciators are made visible at select times. In this fashion it is possible to provide an energy usage indicator equivalent to that of a rotating disk. It is especially desirable for the display signal to be generated so that the annunciators provide a forward and reverse energy flow indication at a rate faster than an equivalent disk rotation rate. In an especially preferred embodiment, three annunciators are located on the display for providing the above indications of electrical energy direction. In that embodiment, the annunciators are arranged in a line. The first annunciator is arrow shaped and indicative of the reverse direction and the third annunciator is arrow shaped and indicative of the forward direction. It is also preferred for the energy signal to be provided to the second processor at a given data rate. In such an embodiment it is especially preferred for the second processor to include a data rate display member for displaying on the display the rate at which data is being provided to the second processor. In such an embodiment, the direction and both the rate at which data is provided to the second processor and a signal mimicking the rate of disk rotation can be displayed. Indicators for each quantity are provided.

BRIEF DESCRIPTION OF THE DRAWINGS

The present invention will be better understood, and its numerous objects and advantages will become apparent to those skilled in the art by reference to the following detailed description of the invention when taken in conjunction with the following drawings, in which.

DETAILED DESCRIPTION

Figure 1:
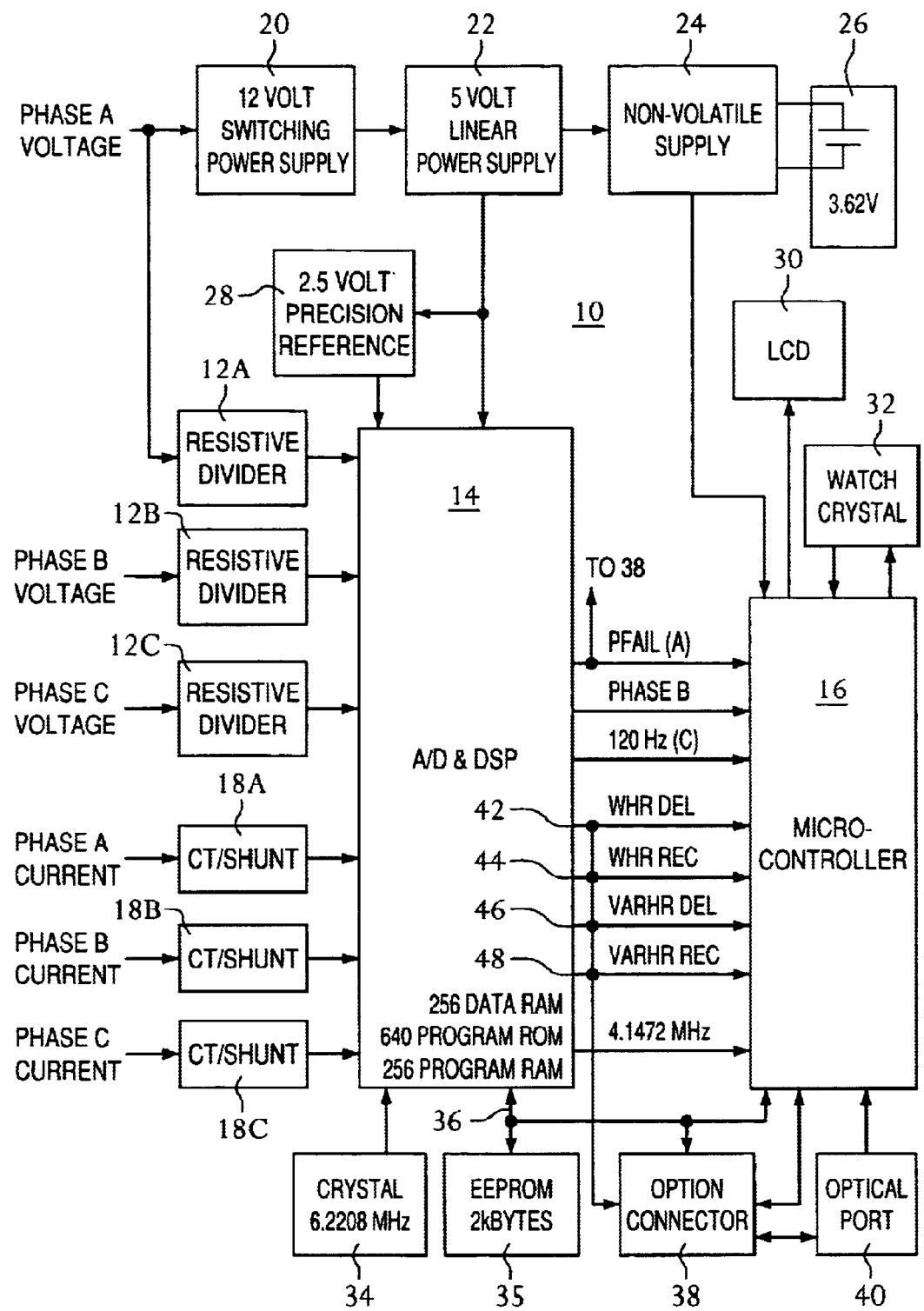
FIG. 1 is a block diagram of an electronic meter constructed in accordance with the present invention.
Figure 2A:
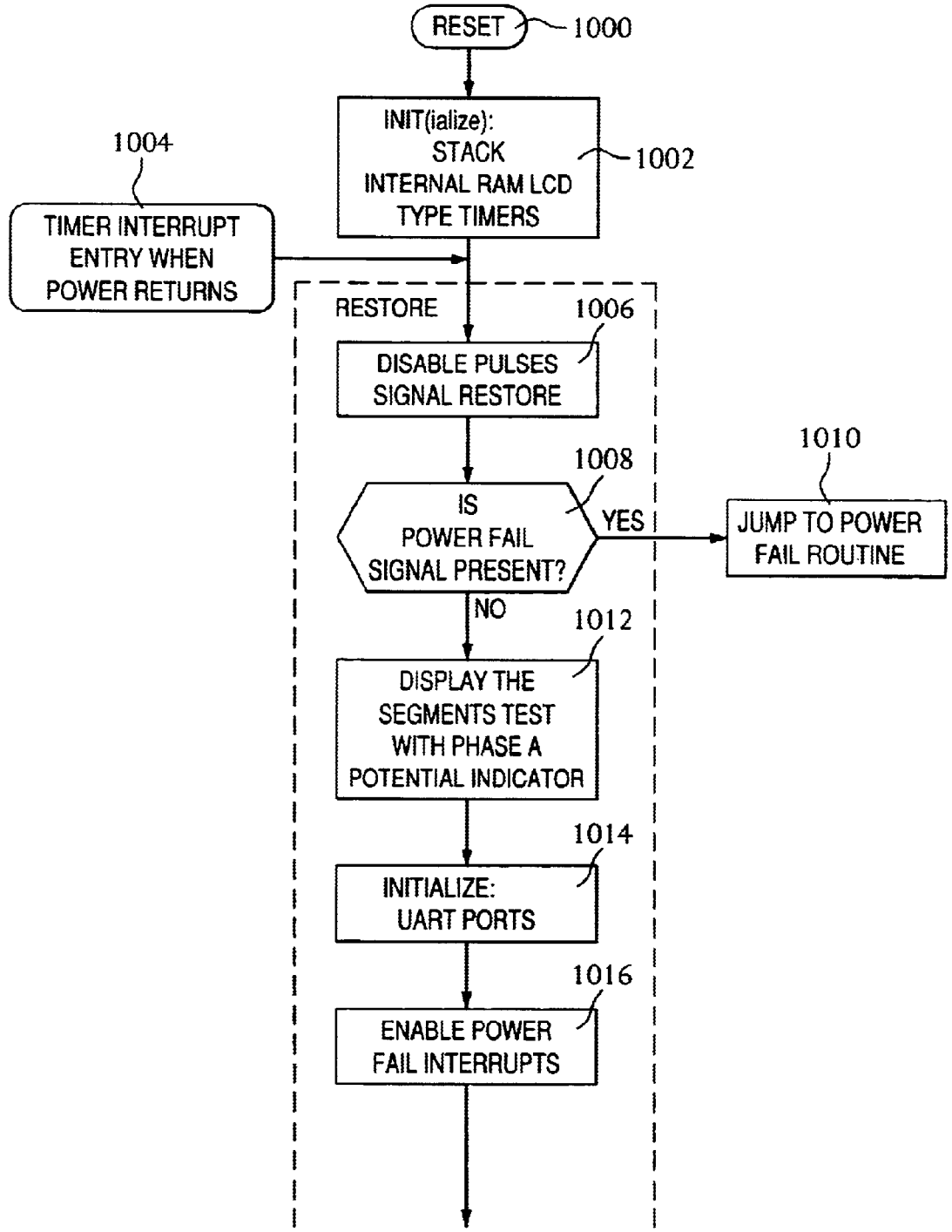
FIGS. 2A–2E combine to provide a flow chart of the primary program utilized by the microcontroller disclosed in FIG. 1.
Figure 2B:
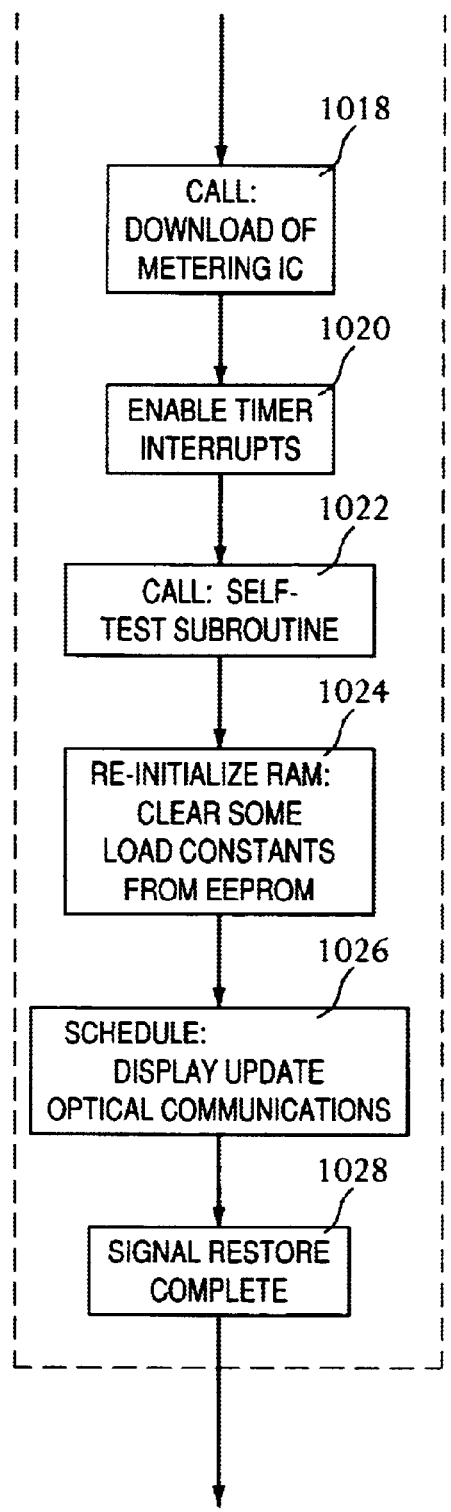
Figure 2C:
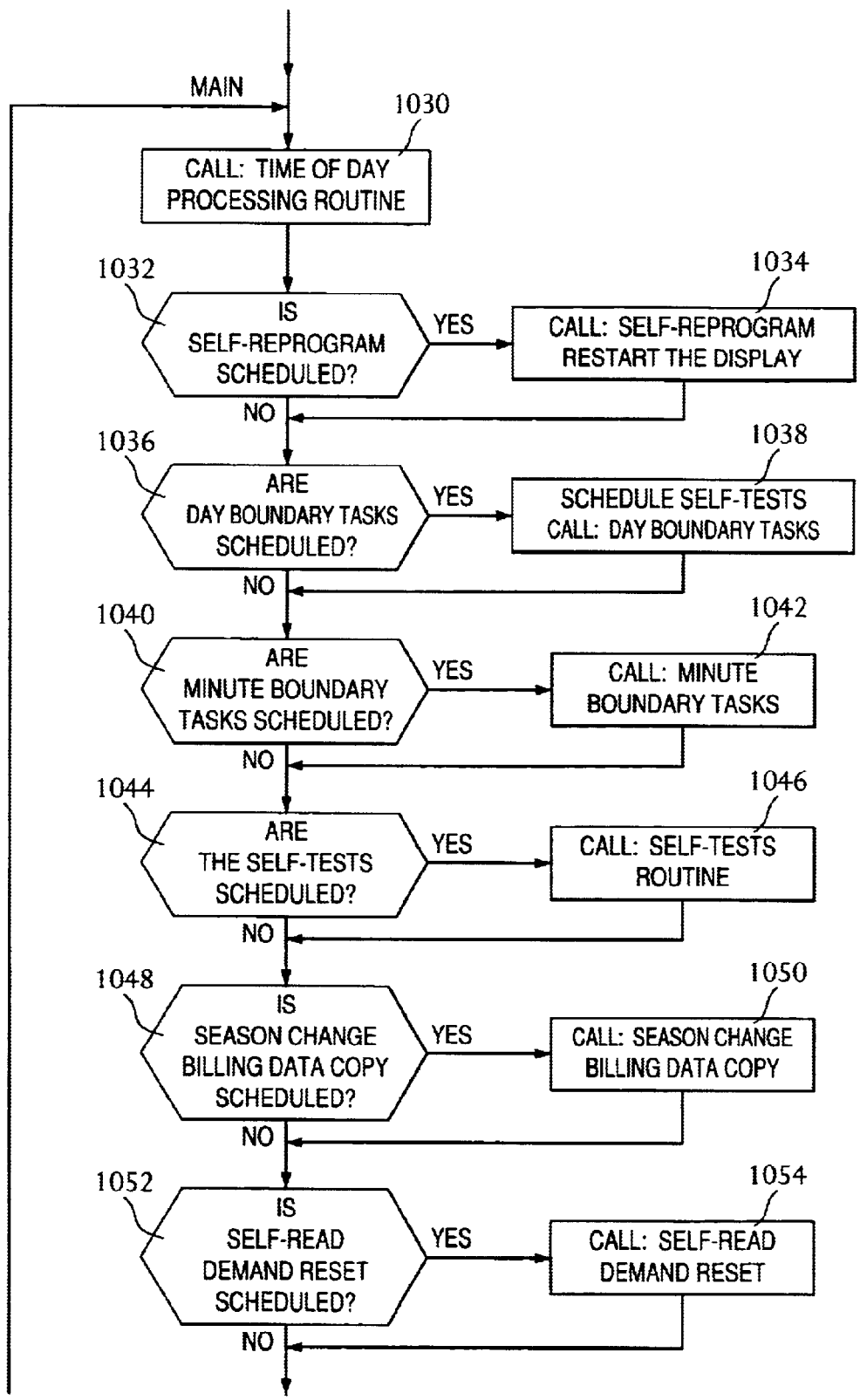
Figure 2D:
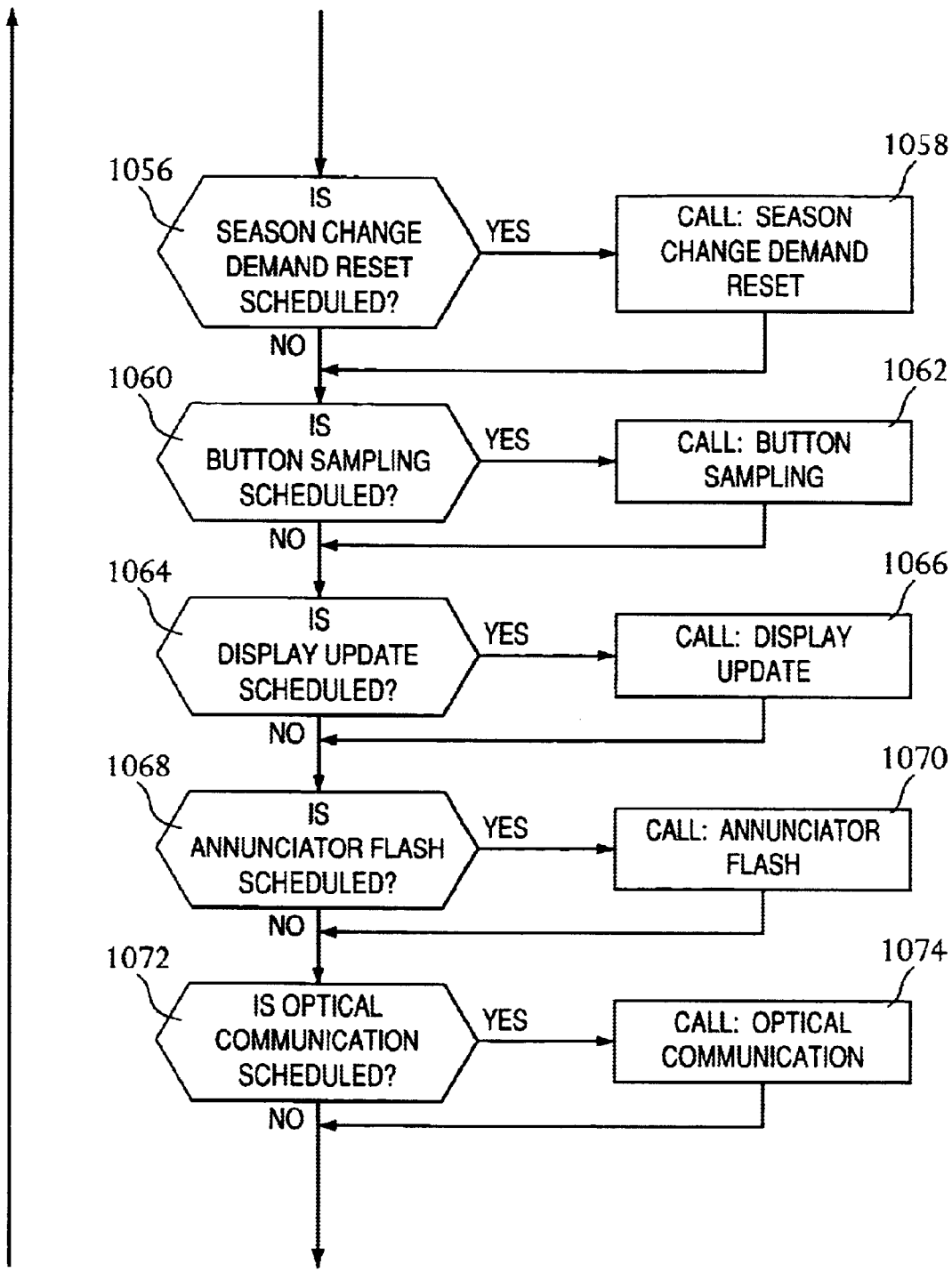
Figure 2E:
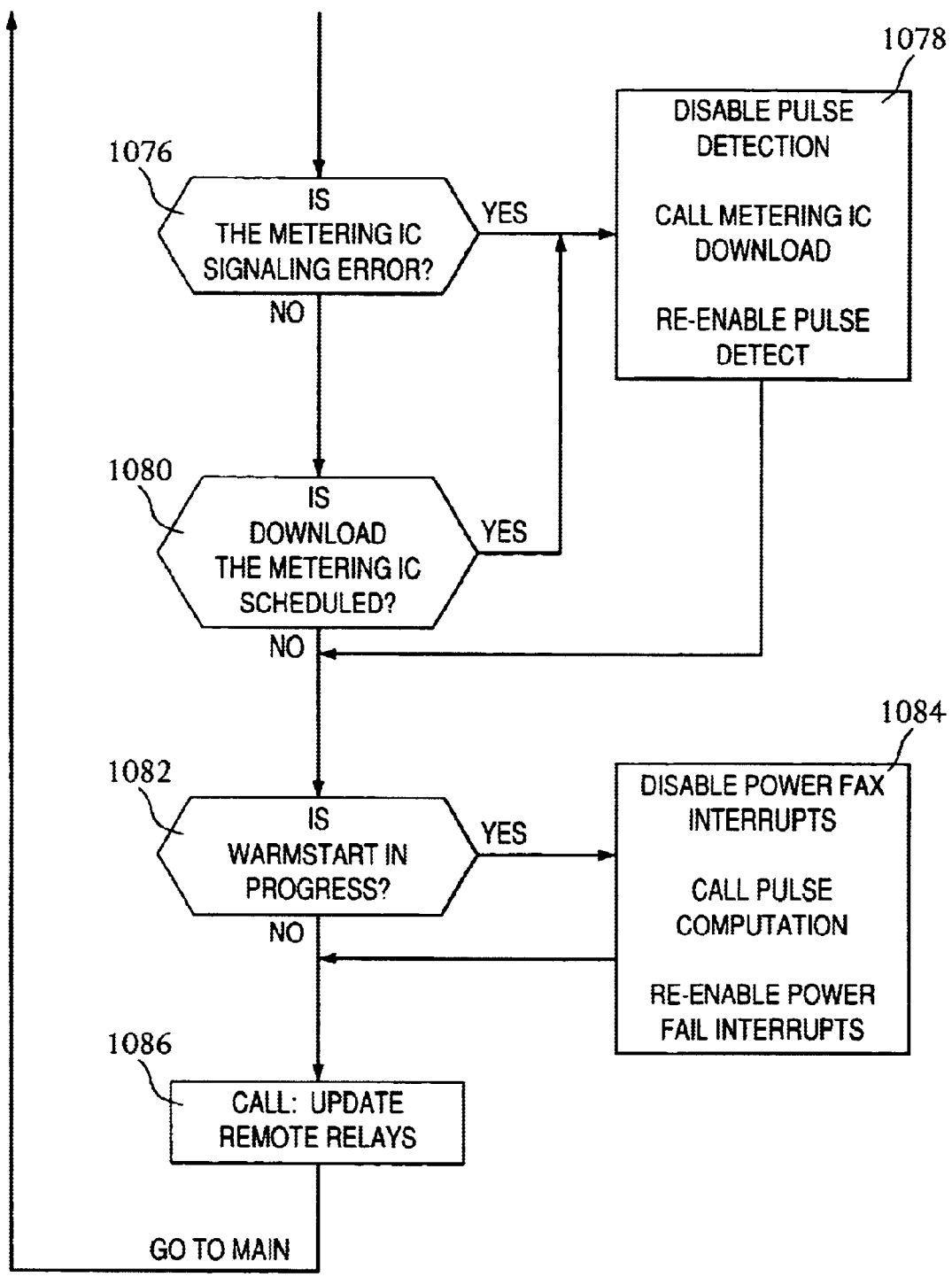

A new and novel meter for metering electrical energy is shown in FIG. 1 and generally designated 10. It is noted at the outset that this meter is constructed so that the future implementation of higher level metering functions can be supported.

Meter 10 is shown to include three resistive voltage divider networks 12A, 12B, 12C; a first processor—an ADC/DSP (analog-to-digital converter/digital signal processor) chip 14; a second processor—a microcontroller 16 which in the preferred embodiment is a Mitsubishi Model 50428 microcontroller; three current sensors 18A, 18B, 18C; a 12V switching power supply 20 that is capable of receiving inputs in the range of 96–528V; a 5V linear power supply 22; a non-volatile power supply 24 that switches to a battery 26 when 5V supply 22 is inoperative; a 2.5V precision voltage reference 28; a liquid crystal display (LCD) 30; a 32.768 kHz oscillator 32; a 6.2208 MHz oscillator 34 that provides timing signals to chip 14 and whose signal is divided by 1.5 to provide a 4.1472 MHz clock signal to microcontroller 16; a 2 kbyte EEPROM 35; a serial communications line 36; an option connector 38; and an optical communications port 40 that may be used to read the meter. The inter-relationship and specific details of each of these components is set out more fully below.

It will be appreciated that electrical energy has both voltage and current characteristics. In relation to meter 10 voltage signals are provided to resistive dividers 12A–12C and current signals are induced in a current transformer (CT) and shunted. The output of CT/shunt combinations 18A–18C is used to determine electrical energy.

First processor 14 is connected to receive the voltage and current signals provided by dividers 12A–12C and shunts 18A–18C. As will be explained in greater detail below, processor 14 converts the voltage and current signals to voltage and current digital signals, determines electrical energy from the voltage and current digital signals and generates an energy signal representative of the electrical energy determination. Processor 14 will always generate watthour delivered (Whr Del) and watthour received (Whr Rec) signals, and depending on the type of energy being metered, will generate either volt amp reactive hour delivered (VARhr Del)/volt amp reactive hour received (VARhr Rec) signals or volt amp hour delivered (VAhr Del)/volt amp hour received (VAhr Rec) signals. In the preferred embodiment, each transition on conductors 42–48 (each transition from logic low to logic high and vice versa) is representative of the measurement of a unit of energy. Second processor 16 is connected to first processor. 14. As will be explained in greater detail below, processor 16 receives the energy signal(s) and generates an indication signal representative of the energy signal (s).

In relation to the preferred embodiment of meter 10, currents and voltages are sensed using conventional current transformers (CT's) and resistive voltage dividers, respectively. The appropriate multiplication is accomplished in a new integrated circuit, i.e. processor 14. Although described in greater detail in relation to FIG. 1, processor 14 is essentially a programmable digital signal processor (DSP) with built in analog to digital (A/D) converters. The converters are capable of sampling three input channels simultaneously at 2400 Hz each with a resolution of 21 bits and then the integral DSP performs various calculations on the results.

Meter 10 can be operated as either a demand meter or as a so-called time of use (TOU) meter. It will be recognized that TOU meters are becoming increasingly popular due to the greater differentiation by which electrical energy is billed. For example, electrical energy metered during peak hours will be billed differently than electrical energy billed during non-peak hours. As will be explained in greater detail below, first processor 14 determines units of electrical energy while processor 16, in the TOU mode, qualifies such energy units in relation to the time such units were determined, i.e. the season as well as the time of day.

All indicators and test features are brought out through the face of meter 10, either on LCD 30 or through optical communications port 40. Power supply 20 for the electronics is a switching power supply feeding low voltage linear supply 22. Such an approach allows a wide operating voltage range for meter 10.

In the preferred embodiment of the present invention, the so-called standard meter components and register electronics are for the first time all located on a single printed circuit board (not shown) defined as an electronics assembly. This electronics assembly houses power supplies 20, 22, 24 and 28, resistive dividers 12A–12C for all three phases, the shunt resistor portion of 18A–18C;

oscillator 34, processor 14, processor 16, reset circuitry (not shown), EEPROM 35, oscillator 32, optical port components 40, LCD 30, and an option board interface 38. When this assembly is used for demand metering, the billing data is stored in EEPROM 35. This same assembly is used for TOU metering applications by merely utilizing battery 26 and reprogramming the configuration data in EEPROM 35.

Consider now the various components of meter 10 in greater detail. Primary current being metered is sensed using conventional current transformers. It is preferred for the current transformer portion of devices 18A–18C have tight ratio error and phase shift specifications in order to limit the factors affecting the calibration of the meter to the electronics assembly itself. Such a limitation tends to enhance the ease with which meter 10 may be programmed. The shunt resistor portion of devices 18A–18C are located on the electronics assembly described above and are preferably metal film resistors with a maximum temperature coefficient of 25 ppm/° C.

The phase voltages are brought directly to the electronic assembly where resistive dividers 12A–12C scale these inputs to processor 14. In the preferred embodiment, the electronic components are referenced to the vector sum of each line voltage for three wire delta systems and to earth ground for all other services. Resistive division is used to divide the input voltage so that a very linear voltage with minimal phase shift over a wide dynamic range can be obtained. This in combination with a switching power supply allows the wide voltage operating range to be implemented.

It will be appreciated that energy units are calculated primarily from multiplication of voltage and current. The specific formulae utilized in the preferred embodiment, are described in greater detail in co-pending application Ser. No. 839,182, filed Feb. 21, 1992 and incorporated herein by reference. However, for purposes of FIG. 1, such formulae are performed in processor 14.

The M37428 microcontroller 16 is a 6502 (a traditional 8 bit microprocessor) derivative with an expanded instruction set for bit test and manipulation. This microcontroller includes substantial functionality including internal LCD drivers (128 quadraplexed segments), 8 kbytes of ROM, 384 bytes of RAM, a full duplex hardware UART, 5 timers, dual clock inputs (32.768 kHz and up to 8 MHz), and a low power operating mode.

During normal operation, processor 16 receives the 4.1472 MHz clock from processor 14 as described above. Such a clock signal translates to a 1.0368 MHz cycle time. Upon power fail, processor 16 shifts to the 32.768 KHz crystal oscillator 32. This allows low power operation with a cycle time of 16.384 kHz. During a power failure, processor 16 keeps track of time by counting seconds and rippling the time forward. Once processor 16 has rippled the time forward, a WIT instruction is executed which places the unit in a mode where only the 32.768 kHz oscillator and the timers are operational. While in this mode a timer is setup to "wake up" processor 16 every 32,768 cycles to count a second.

While power supply 20 can be any known power supply for providing the required direct current power, a preferred form of power supply 20 is described in detail in copending application Ser. No. 839,976, filed Feb. 21, 1992 and which is incorporated herein by reference.

Consider now the main operation of processor 16 in relation to FIGS. 2A–2E and FIG. 3. At step 1000 a reset signal is provided to microcontroller 16. A reset cycle occurs whenever the voltage level $V_{dd}$ rises through approximately 2.8 volts. Such a condition occurs when the meter is powered up.

At step 1002, microcontroller 16 performs an initialize operation, wherein the stack pointer is initialized, the internal ram is initialized, the type of liquid crystal display is entered into the display driver portion of microcontroller 16 and timers which requires initialization at power up are initialized. It will be noted that the operation of step 1002 does not need to be performed for each power failure occurrence. Following a power failure, microcontroller 16 at step 1004 returns to the main program at the point indicated when the power returns.

Upon initial power up or the return of power after a power failure, microcontroller 16 performs a restore function. At step 1006, microcontroller 16 disables pulses transmitted by processor 14. These pulses are disabled by providing the appropriate signal restore bit. The presence of this bit indicates that a restore operation is occurring and that pulses generated during that time should be ignored. Having set the signal restore bit, microcontroller 16 determines at step 1008 whether the power fail signal is present. If the power fail signal is present, microcontroller 16 jumps to the power fail routine at 1010. In the power fail routine, the output ports of microcontroller 16 are written low unless the restore bit has not been set. If the restore bit has not been set, data in the microcontroller 16 is written to memory.

If the power fail signal is not present, microcontroller 16 displays segments at step 1012. At this time, the segments of the display are illuminated using the phase A potential. It will be recalled that phase A potential is provided to microcontroller 16 from processor 14. At 1014, the UART port and other ports are initialized at 1016, the power fail interrupts are enabled such that if a falling edge is sensed from output A of processor 14, an interrupt will occur indicating power failure. It will be recalled that processor 14 compares the reference voltage VREF to a divided voltage generated by the power supply 20. Whenever the power supply voltage falls below the reference voltage a power fail condition is occurring.

At step 1018, the downloading of the metering integrated circuit is performed. It will be appreciated that certain tasks performed by microcontroller 16 are time dependent. Such tasks will require a timer interrupt when the time for performing such tasks has arrived.

At 1022, the self-test subroutines are performed. Although no particular self-tests subroutine is necessary in order to practice the present invention, such subroutines can include a check to determine if proper display data is present. It is noted that data is stored in relation to class designation and that a value is assigned to each class such that the sum of the class values equals a specified number. If any display data is missing, the condition of the class values for data which is present will not equal the specified sum and an error message will be displayed. Similarly, microcontroller 16 compares the clock signal generated by processor 14 with the clock signal generated by watch crystal 32 in order to determine whether the appropriate relationship exists.

Having completed the self-test subroutines, the ram is re-initialized at 1024. In this re-initialization, certain load constants are cleared from memory. At 1026, various items are scheduled. For example, the display update is scheduled so that as soon as the restore routine is completed, data is retrieved and the display is updated. Similarly, optical communications are scheduled wherein microcontroller 16 determines whether any device is present at optical port desired to communicate. Finally, at 1028 a signal is given indicating that the restore routine has been completed. Such a signal can include disabling the signal restore bit. Upon such an occurrence, pulses previously disabled will now be considered valid. Microcontroller 16 now moves into the main routine.

At 1030, microcontroller 16 calls the time of day processing routine. In this routine, microcontroller 16 looks at the one second bit of its internal and determines whether the clock needs to be changed. For example, at the beginning and end of Daylight Savings Time, the clock is moved forward and back one hour, respectively. In addition, the time of day processing routine sets the minute change flags and date change flags. As will be appreciated hereinafter, such flags are periodically checked and processes occur if such flags are present.

It will be noted that there are two real time interrupts scheduled in microcontroller 16 which are not shown in FIG. 2, namely the roll minute interrupt and the day interrupt. At the beginning of every minute, certain minute tasks occur. Similarly, at the beginning of every day, certain day tasks occur. Since such tasks are not necessary to the practice of the presently claimed invention, no further details need be provided.

At 1032, microcontroller 16 determines whether a self-reprogram routine is scheduled. If the self-reprogram routine is scheduled, such routine is called at 1034. The self-reprogram typically programs in new utility rates which are stored in advance. Since new rates have been incorporated, it will be necessary to also restart the display. After operation of the self-reprogram routine, microcontroller 16 returns to the main program. If it is determined at 1032 that the self-reprogram routine is not scheduled, microcontroller 16 determines at 1036 whether any day boundary tasks are scheduled. Such a determination is made by determining the time and day and searching to see whether any day tasks are scheduled for that day. If day tasks are scheduled, such tasks are called at 1038. If no day tasks are scheduled, microcontroller 16 next determines at 1040 whether any minute boundary tasks have been scheduled. It will be understood that since time of use switch points occur at minute boundaries, for example, switching from one use period to another, it will be necessary to change data storage locations at such a point. If minute tasks are scheduled, such tasks are called at 1042. If minute boundary tasks have not been scheduled, microcontroller 16 determines at 1044 whether any self-test have been scheduled. The self-tests are typically scheduled to occur on the day boundary. As indicated previously, such self-tests can include checking the accumulative display data class value to determine whether the sum is equal to a prescribed value. If self-tests are scheduled, such tests are called at 1046. If no self-tests are scheduled, microcontroller 16 determines at 1048 whether any season change billing data copy is scheduled. It will be appreciated that as season changes billing data changes. Consequently, it will be necessary for microcontroller 16 to store energy metered for one season and begin accumulating energy metered for the following season. If season change billing data copy is scheduled, such routine is called at 1050. If no season change routine is scheduled, microcontroller 16 determines at 1052 whether the self-redemand reset has been scheduled. If the self-redemand reset is scheduled, such routine is called at 1054. This routine requires microcontroller 16 to in effect read itself and store the read value in memory. The self-redemand is then reset. If self-redemand reset has not been scheduled, microcontroller 16 determines at 1056 whether a season change demand reset has been scheduled. If a season change demand reset is scheduled, such a routine is called at 1058. In such a routine, microcontroller 16 reads itself and resets the demand.

Figure 6:
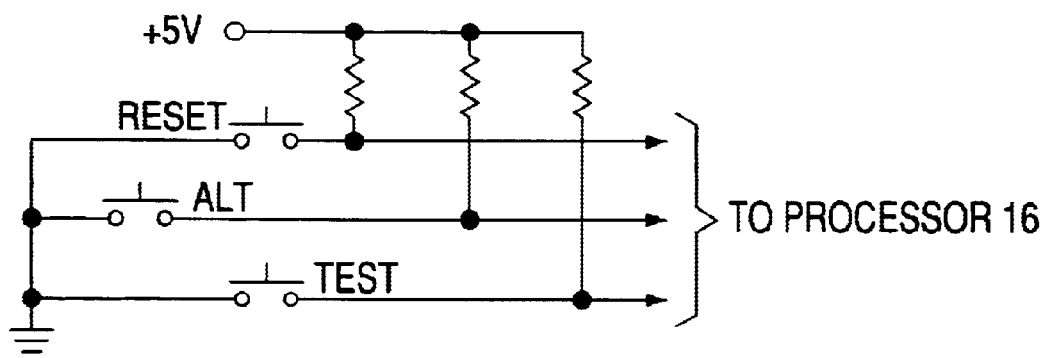
FIG. 6 is a schematic diagram of certain command buttons contained in the meter.

At 1060, microcontroller 16 determines whether button sampling has been scheduled. Button sampling will occur every eight milliseconds. Reference is made to FIG. 6 for a more detailed description of an arrangement of buttons to be positioned on the face of meter 10. Consequently, if an eight millisecond period has passed, microcontroller 16 will determine that button sampling is scheduled and the button sampling routine will be called at 1062. If button sampling is not scheduled, microcontroller 16 determines at 1064 whether a display update has been scheduled. This routine causes a new quantity to be displayed on LCD 30. As determined by the soft switch settings, display updates are scheduled generally for every three-six seconds. If the display is updated more frequently, it may not be possible to read the display accurately. If the display update has been scheduled, the display update routine is called at 1066. If a display update has not been scheduled, microcontroller 16 determines at 1068 whether an annunciator flash is scheduled. It will be recalled that certain annunciators on the display are made to flash. Such flashing typically occurs every half second. If an annunciator flash is scheduled, such a routine is called at 1070. It is noted in the preferred embodiment that a directional annunciator will flash at the same rate at which energy determination pulses are transmitted from processor 14 to processor 16. Another novel feature of the invention is that other annunciators (not indicative of energy direction) will flash at a rate approximately equal to the rate of disk rotation in an electromechanical meter used in a similar application.

If no annunciator flash is scheduled, microcontroller 16 determines at 1072 whether optical communication has been scheduled. It will be recalled that every half second microcontroller 16 determines whether any signal has been generated at optical port. If a signal has been generated indicating that optical communications is desired, the optical communication routine will be scheduled. If the optical communication routine is scheduled, such routine is called at 1074. This routine causes microcontroller 16 to sample optical port 40 for communications activity. If no optical routine is scheduled, microcontroller 16 determines at 1076 whether processor 14 is signaling an error. If processor 14 is signaling an error, microcontroller 16 at 1078 disables the pulse detection, calls the download routine and after performance of that routine, re-enables the pulse detection. If processor 14 is not signaling any error, microcontroller 16 determines at 1080 whether the download program is scheduled. If the download program is scheduled, the main routine returns to 1078 and thereafter back to the main program.

If the download program has not been scheduled or after the pulse detect has been re-enabled, microcontroller 16 determines at 1082 whether a warmstart is in progress. If a warmstart is in progress, the power fail interrupts are disabled at 1084. The pulse computation routine is called after which the power fail interrupts are re-enabled. It will be noted that in the warmstart data is zeroed out in order to provide a fresh start for the meter. Consequently, the pulse computation routine performs the necessary calculations for energy previously metered in places that computation in the appropriate point in memory. If a warmstart is not in progress, microcontroller 16 at 1086 updates the remote relays. Typically, the remote relays are contained on a board other than the electronics assembly board.

All data that is considered non-volatile for meter 10, is stored in a 2 kbytes EEPROM 35. This includes configuration data (including the data for memory 76 and memory 80), total kWh, maximum and cumulative demands (Rate A demands in TOU), historic TOU data, cumulative number of demand resets, cumulative number of power outages and the cumulative number of data altering communications. The present billing period TOU data is stored in the RAM contained within processor 16. As long as the microcontroller 16 has adequate power, the RAM contents and real time are maintained and the microcontroller 16 will not be reset (even in a demand register).

LCD 30 allows viewing of the billing and other metering data and statuses. Temperature compensation for LCD 30 is provided in the electronics. Even with this compensation, the meter's operating temperature range and the LCD's 5 volt fluid limits LCD 30 to being triplexed. Hence, the maximum number of segments supported in this design is 96. The display response time will also slow noticeably at temperatures below −30 degrees celsius. For a more complete description of the generation of a display signal for display 30, reference is made to co-pending application Ser. No. 839,182, filed Feb. 21, 1992 and incorporated herein by reference.

Figure 3:
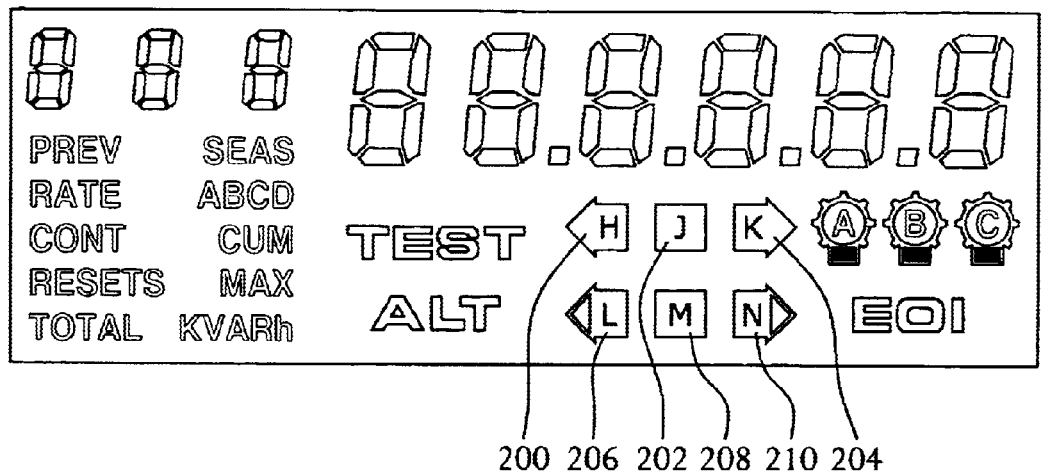
FIG. 3 is a front elevation of the liquid crystal display shown in FIG. 1.

The 96 available LCD segments, shown in FIG. 3, are used as follows. Six digits (0.375 high) are used for data display and three smaller digits (0.25 high) for numeric identifiers. In addition to the numeric identifiers, there are seventeen alpha annunciators that are used for identification. These are: PREV, SEAS, RATE, A, B, C, D, CONT, CUM, RESETS, MAX, TOTAL, KV /, \, −\, R, and h. The last five annunciators can be combined to produce: KW, KWh, KVA, KVAh, KVAR, or KVARh, as shown. Three potential indicators are provided on the LCD and appear as light bulbs. These indicators operate individually and are on continuously when the corresponding phase's potential is greater than 57.6 Vrms, and flash when the potential falls below 38.4

Vrms. "TEST" "ALT", and "EOI" annunciators are provided to give an indication of when the unit is in test mode, alternate scroll mode, or an end of a demand interval has occurred. Six (6) pulse indicators 200–210 are also provided on LCD 30 for watt-hours and an alternate quantity (VA-hours or VAR-hours).

Pulse indicators 200–210 are configured as two sets of three, one set for indicating watts and another set for indicating VARhours. Each set has a left arrow, a solid square, and a right arrow. During any test, one of the arrows will be made to blink at the rate microcontoller 16 receives pulses from processor 14 while the square will blink at a lower rate representative of a disk rotation rate and in a fashion which mimics disk rotation. It will be noted that signals necessary to flash indicators 200–210 are generated by processor 16 in energy pulse interrupt routines. The left arrow 200 blinks when energy is received from the metered site and the right arrow 204 blinks when energy is delivered to the metered site. The solid square 202 blinks at a Kh rate equivalent to an electro-mechanical meter of the same form, test amperes, and test voltage. Square 202 blinks regardless of the direction of energy flow. The rate at which square 202 blinks can be generated by dividing the rate at which pulses are provided to processor 16. Consequently, testing can occur at traditional rates (indicative of disk rotation) or can occur at faster rates, thereby reducing test time. Indicators 206–210 operate in a similar fashion, except in relation to apparent reactive energy flow.

These pulse indicators can be detected through the meter cover using the reflective assemblies (such as the Skan-A-Matic C42100) of existing test equipment. As indicated above, the second set of three indicators indicate apparent reactive energy flow and have the tips of arrows 206 and 210 open so that they will not be confused with the watt-hour indicators.

Figure 4:
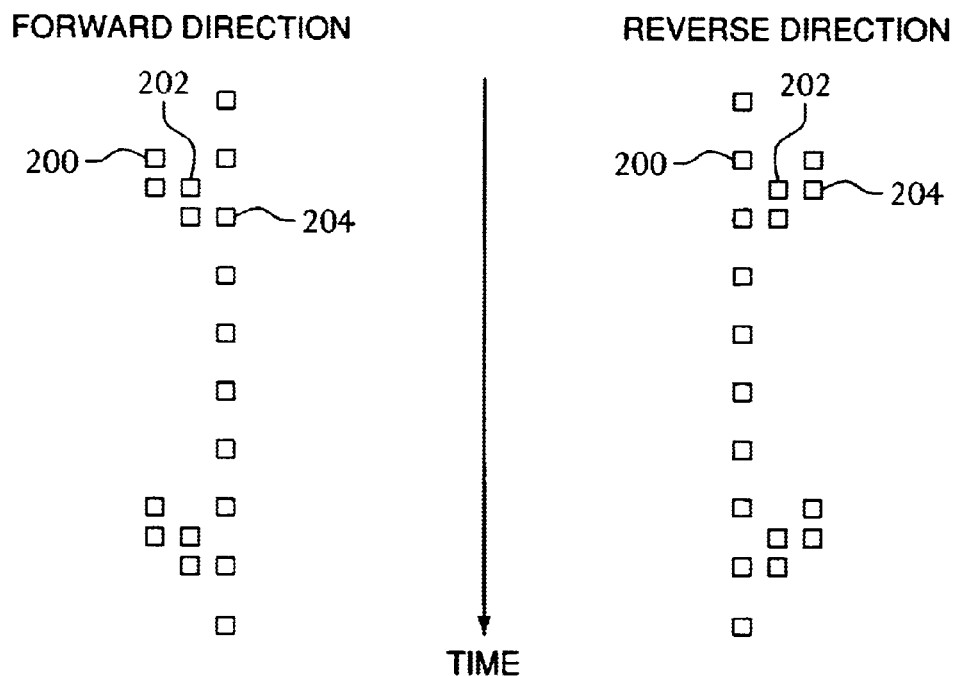
FIG. 4 is a diagrammatic view of select annunciators of the liquid crystal display shown in FIG. 3.

Referring to FIG. 4, it will be seen that annunciators 200–204 are positioned along a line, wherein annunciator 202 is positioned between annunciators 200 and 204. As time progresses, processor 16 generates display signals so that, when energy is flowing in the forward direction, annunciator 204 always flashes. However, annunciators 200 and 202 can be made to flash selectively, to create the impression that energy is flowing from left to right. When energy is flowing in the reverse direction, the reverse is true. Annunciator 200 flashes continuously, and annunciators 202 and 204 flash selectively to mimic energy flowing from right to left.

Meter 10 interfaces to the outside world via liquid crystal display 30, optical port 40, or option connector 38. It is envisioned that most utility customers will interface to LCD 30 for testing of the meter, some utilities will desire an infrared LED, such as LED 112, to test the meter calibration. Traditionally, electronic meters have provided a single light emitting diode (LED) in addition to an optical port to output a watthour pulse. Such designs add cost, decrease reliability and limit test capabilities. The present invention overcomes these limitations by multiplexing the various metering function output signals and pulse rates over optical port 40 alone. Meter 10 echoes the kh value watthour test output on optical port 40 anytime the meter has been manually placed in the test mode (the TEST command button in FIG. 6 has been pressed) or alternate scroll mode (the ALT command button in FIG. 6 has been pressed). While in these manually initiated modes, communication into processor 16 through optical port 40 is prevented. It is noted that in the preferred embodiment, the ALT button is capable of being enabled without removal of the meter cover (not shown). To this end a small movable shaft (not shown) is provided in the meter cover so that when the shaft is moved the ALT component is enabled. Consequently, removal of the meter cover is not necessary in order to test the meter.

Figure 5:
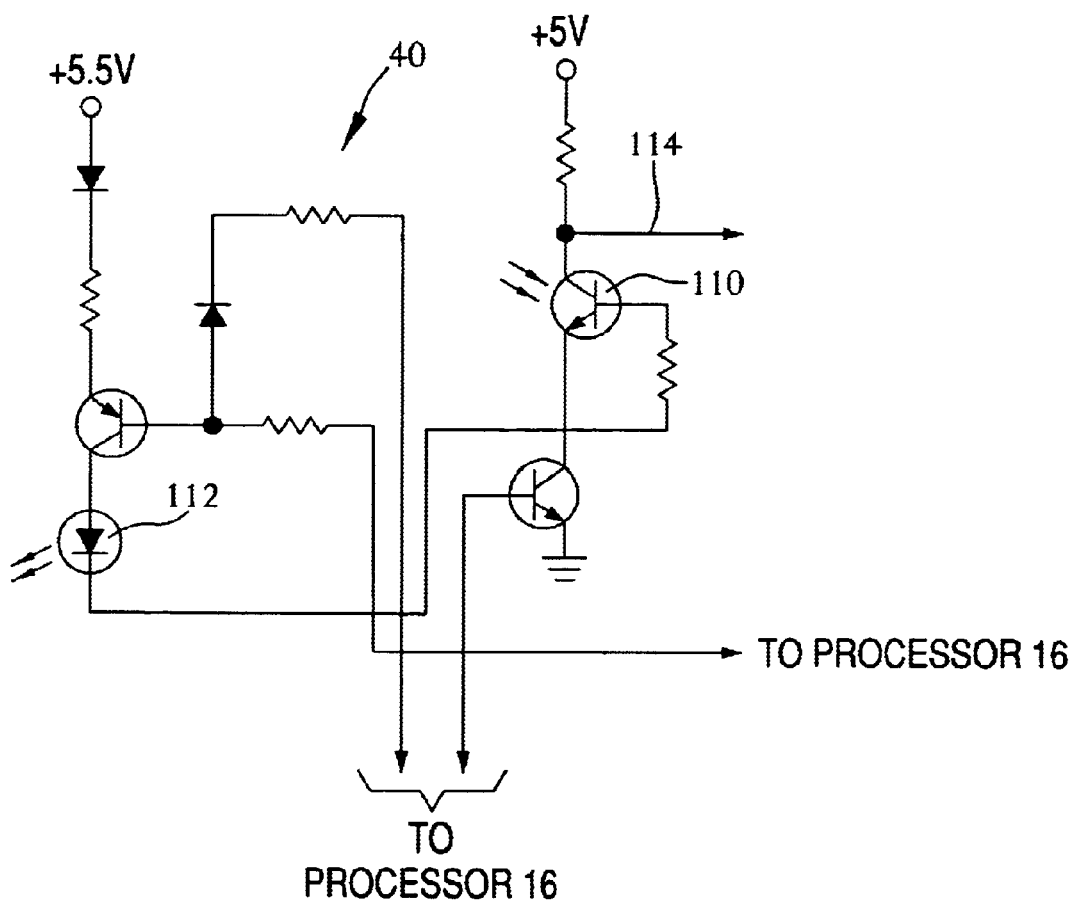
FIG. 5 is a schematic diagram of the optical port shown in FIG. 1.

Referring now to FIG. 5 and 6, optical port 40 and reset circuitry 108 are shown in greater detail respectively. Optical port 40 provides electronic access to metering information. The transmitter (LED 112) and receiver transistor 110 are preferably 850 nanometer infrared components and are contained in the electronics assembly (as opposed to being mounted in the cover). Transistor 110 and led 112 are tied to a UART included within microcontroller 16 and the communications rate (9600 baud) is limited by the response time of the optical components. The optical port can also be disabled from the UART (as described below), allowing the UART to be used for other future communications without concern about ambient light. During test mode, optical port 40 will echo the watthour pulses received by the microcontroller over the transmitting LED 112 to conform to traditional testing practices without the necessity of an additional LED.

Meter 10 also provides the ability to be placed in the test mode and exit from the test mode via an optical port function, preferably with a data command. When in a test mode initiated via optical port 40, the meter will echo metering pulses as defined by the command. This allows the multiplexing of metering functions or pulse rates over a single LED. In the preferred embodiment, such a multiplexing scheme is a time based multiplexing operation. The meter will listen for further communications commands. Additional commands can change the rate or measured quantity of the test output over optical port 40. The meter will "ACK" any command sent while it is in the test mode and it will "ACK" the exit test mode command. While in an optically initiated test mode, commands other than those mentioned above are processed normally. Because there is the possibility of an echoed pulse confusing the programmer-readers receiver, a command to stop the pulse echo may be desired so communications can proceed uninterrupted. If left in test mode, the usual test mode time out of three demand intervals applies.

The data command identified above is called "Enter Test Mode" and is followed by 1 data byte defined below. The command is acknowledged by processor 16 the same as other communications commands. The command places meter 10 into the standard test mode. While in this mode, communications inter-command timeouts do not apply. Hence, the communications session does not end unless a terminate session command is transmitted or test mode is terminated by any of the normal ways of exiting test mode (pressing the test button, power failure, etc.), including the no activity timeout. Display 30 cycles through the normal test mode display sequence (see the main program at 1044, 1060 and 1064) and button presses perform their normal test mode functions. Transmitting this command multiple times causes the test mode, and its associated timeout counter, to restart after each transmission.

The data byte defines what input pulse line(s) to processor 16 should be multiplexed and echoed over optical port 40. Multiple lines can be set to perform a totalizing function. The definition of each bit in the data byte is as follows:

bit0=alternate test pulses,
bit1=alternate delivered pulses,
bit2=alternate received pulses,
bit3=whr test pulses,
bit4=whr delivered pulses, bit5=whr received pulses, bits 6 and 7 are unused.

If no bits are set, the meter stops echoing pulses. This can be used to allow other communications commands to be sent without fear of data collision with the output pulses. While in this mode, other communications commands can be accepted. The test data can be read, the meter can be reprogrammed, the billing data can be reset or a warmstart can be initiated. Since the Total KWH and Maximum Demand information is stored to EEPROM 35, test data is being processed in memory areas and functions such as demand reset and warmstart will operate on the Test Mode data and not the actual billing data. Any subsequent "Enter Test Mode Command" resets the test mode data just as a manual demand reset would in the test mode.

This command also provides the utility with a way to enter the test mode without having to remove the meter cover. This will be beneficial to some utilities.

While the invention has been described and illustrated with reference to specific embodiments, those skilled in the art will recognize that modification and variations may be made without departing from the principles of the invention as described herein above and set forth in the following claims.

What is claimed is:

1. In an electronic energy meter which senses input voltage and current signals and processes the input voltage and current signals to generate measurements of various types of power, and wherein said electronic energy meter includes one optical communications port, a method of providing optical test signals for electronic meter testing comprising the steps of:

selecting one of said various types of power and defining the same as the selected type of power;

generating a test signal representative of a measurement of the selected type of power; and transmitting the test signal over said optical communications port for receipt and processing by standard calibration test equipment.

2. The method of claim 1, wherein the various types of power include real power, reactive power and apparent power, wherein the step of selecting one of the various types of power further comprises the step of:

selecting between real power, reactive power and apparent power.

3. The method of claim 2, further comprising the steps of:

selecting additional other ones of the various types of power;

generating additional test signals, wherein each of the additional test signals is related to one of the additional selected types of power;

transmitting each test signal over said optical communications port.

4. The method of claim 2, wherein said various types of power are indicative of one of total power, power received, and power delivered, wherein the step of selecting one of the various types of power further comprises the step of:

selecting between total power, power received and power delivered.

5. The method of claim 4, further comprising the steps of:

selecting additional other ones of the various types of power;

generating additional test signals, wherein each of the additional test signals is related to one of the additional selected types of power;

transmitting each test signal over said optical communications port.

6. The method of claim 1, wherein said various types of power are indicative of one of total power, power received, and power delivered, wherein the step of selecting one of the various types of power further comprises the step of:

selecting between total power, power received and power delivered.

7. The method of claim 6, further comprising the steps of:

selecting additional other ones of the various types of power;

generating additional test signals, wherein each of the additional test signals is related to one of the additional selected types of power; and transmitting each test signal over said optical communications port.

8. The method of claim 1, wherein the test signal is a pulsed signal having a pulse rate substantially equal to the Kh value.

9. The method of claim 1, wherein the test signal is a pulsed signal having a pulse rate substantially equal to the Ke value.

10. The method of claim 1, wherein the test signal is a pulsed signal, the method further comprising the step of:

selecting one of the Kh value or the Ke value as the pulse rate of the test signal to be transmitted.

11. The method of claim 1, further comprising the steps of:

receiving a data command over the optical communication port; and selecting the selected type of power based on information provided by the data command.

12. The method of claim 1, further comprising the steps of:

receiving communications over the optical communications port while transmitting the test signal; and transmitting communications and the test signal over the optical communications port.

13. The method of claim 1, wherein the optical communications port is the only means provided by the electronic energy meter for outputting the test signal.

14. In an electronic energy meter which senses input voltage and current signals and processes the input voltage and current signals to generate measurements of various types of power including real power, reactive power, and apparent power and wherein said electronic energy meter comprises a communications interface, a method of providing optical test signals for electronic meter testing comprising the steps of:

receiving a data command over the communications interface;

selecting, in response to the data command, one of the various types of power by selecting between real power, reactive power and apparent power to define a selected type of power;

generating a test signal representative of a measurement of the selected type of power; and transmitting the test signal over the communications interface.

15. The method of claim 14, wherein said various types of power are indicative of one of total power, power received, and power delivered, wherein the step of selecting one of the various types of power further comprises the step of:

selecting between total power, power received and power delivered in response to the data command.

16. The method of claim 14, wherein the test signal is a pulsed signal, the step of selecting one of the various types of power further comprises the step of:

selecting one of the Kh value or the Ke value as the pulse rate of the test signal in response to the data command.

17. The method of claim 14, further comprising the steps of:

receiving at least one additional data command;

selecting additional other ones of the various types of power in response to the additional data command;

generating additional test signals, wherein each of the additional test signals is related to one of the additional selected types of power; and transmitting each test signal over the communications interface.

18. The method of claim 14, wherein standard calibration test equipment can be used to receive and process the test signal output from the communications interface.

19. The method of claim 14, wherein the communications interface is an optical communications port.

20. In an electronic energy meter which senses input voltage and current signals and processes the input voltage and current signals to generate measurements of various types of power, and wherein said electronic energy meter includes one optical communications port, a method of providing optical test signals for electronic meter testing comprising the steps of:

selecting one of said various types of power and defining the same as the selected type of power;

generating a test signal representative of a measurement of the selected type of power; and transmitting the test signal over said optical communications port.

21. The method of claim 20, wherein the various types of power include real power, reactive power and apparent power, wherein the step of selecting one of the various types of power further comprises the step of:

selecting between real power, reactive power, and apparent power.

22. The method of claim 21, further comprising the steps of:

selecting additional other ones of the various types of power;

generating additional test signals, wherein each of the additional test signals is related to one of the additional selected types of power; and transmitting each test signal over said optical communications port.

23. The method of claim 21, wherein said various types of power are indicative of one of total power, power received, and power delivered, wherein the step of selecting one of the various types of power further comprises the step of:

selecting between total power, power received and power delivered.

24. The method of claim 23, further comprising the steps of:

selecting additional other ones of the various types of power;

generating additional test signals, wherein each of the additional test signals is related to one of the additional selected types of power;

transmitting each test signal over said optical communications port.

25. The method of claim 20, wherein said various types of power are indicative of one of total power, power received, and power delivered, wherein the step of selecting one of the various types of power further comprises the step to:

selecting between total power, power received and power delivered.

26. The method of claim 25, further comprising the steps of:

selecting additional other ones of the various types of power;

generating additional test signals, wherein each of the additional test signals is related to one of the additional selected types of power; and transmitting each test signal over said optical communications port.

27. The method of claim 20, wherein the test signal is a pulsed signal having a pulse rate substantially equal to the Kh value.

28. The method of claim 20, wherein the test signal is a pulsed signal having a pulse rate substantially equal to the Ke value.

29. The method of claim 20, wherein the test signal is a pulsed signal, the method further comprising the step of:

selecting one of the Kh value or the Ke value as the pulse rate of the test signal to be transmitted.

30. The method of claim 20, further comprising the steps of:

receiving a data command over the optical communication port; and selecting the selected type of power based on information provided by the data command.

31. The method of claim 20, further comprising the steps of:

receiving communications over the optical communications port while transmitting the test signal; and transmitting communications and the test signal over the optical communications port.

32. The method of claim 20, wherein the optical communications port is the only means provided by the electronic energy meter for outputting the test signal.

33. The method of claim 20, wherein standard calibration test equipment can be used to receive and process the transmitted test signal.

* * * * *